United States Patent
Zhou et al.

(10) Patent No.: US 10,497,578 B2
(45) Date of Patent: Dec. 3, 2019

(54) METHODS FOR HIGH TEMPERATURE ETCHING A MATERIAL LAYER USING PROTECTION COATING

(71) Applicant: Applied Materials, Inc., Santa Clara, CA (US)

(72) Inventors: Hailong Zhou, San Jose, CA (US); Gene Lee, San Jose, CA (US); Abhijit Patil, San Jose, CA (US); Shan Jiang, San Jose, CA (US); Akhil Mehrotra, Sunnyvale, CA (US); Jonathan Kim, Danville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/216,948

(22) Filed: Jul. 22, 2016

(65) Prior Publication Data

US 2018/0025914 A1 Jan. 25, 2018

(51) Int. Cl.
*H01L 21/02* (2006.01)
*H01L 21/311* (2006.01)
*H01L 21/3213* (2006.01)

(52) U.S. Cl.
CPC .... *H01L 21/31116* (2013.01); *H01L 21/0214* (2013.01); *H01L 21/02167* (2013.01); *H01L 21/02172* (2013.01); *H01L 21/02214* (2013.01); *H01L 21/02219* (2013.01); *H01L 21/02274* (2013.01); *H01L 21/32135* (2013.01); *H01L 21/32136* (2013.01); *H01L 21/32137* (2013.01)

(58) Field of Classification Search
None
See application file for complete search history.

(56) References Cited

U.S. PATENT DOCUMENTS

| 5,767,018 | A | * | 6/1998 | Bell | H01L 21/32135 257/E21.31 |
|---|---|---|---|---|---|
| 6,291,356 | B1 | * | 9/2001 | Ionov | H01L 21/0276 438/710 |
| 6,346,183 | B1 | * | 2/2002 | Baer | G03F 7/091 204/192.2 |
| 6,518,206 | B1 | * | 2/2003 | Kumar | H01L 21/0276 257/E21.029 |

(Continued)

*Primary Examiner* — Stephanie P Duclair
(74) *Attorney, Agent, or Firm* — Patterson + Sheridan, LLP

(57) ABSTRACT

Methods for etching a bottom anti-reflective coating (BARC) and/or an anti-reflective coating (ARC) and/or a dielectric anti-reflective coating (DARC) to form high aspect ratio features using an etch process are provided. The methods described herein advantageously facilitate profile and dimension control of features with high aspect ratios through a proper sidewall and bottom management scheme during the bottom anti-reflective coating (BARC) and/or an anti-reflective coating (ARC) and/or a dielectric anti-reflective coating (DARC) open process. In one embodiment, a method for etching a dielectric anti-reflective coating (DARC) layer to form features in the DARC layer includes supplying an etching gas mixture onto a DARC layer disposed on a substrate, wherein the substrate is disposed on a substrate support pedestal assembly disposed in a processing chamber, controlling a temperature of the substrate support pedestal assembly greater than 110 degrees Celsius, and etching the DARC layer disposed on the substrate.

16 Claims, 4 Drawing Sheets

(56) References Cited

U.S. PATENT DOCUMENTS

| | | |
|---|---|---|
| 6,916,746 B1 | 7/2005 | Hudson et al. |
| 7,294,580 B2 | 11/2007 | Yun et al. |
| 7,683,447 B2 | 3/2010 | Wang et al. |
| 7,767,977 B1 | 8/2010 | Godet et al. |
| 7,888,653 B2 | 2/2011 | Kellerman et al. |
| 7,910,489 B2 | 3/2011 | Kim et al. |
| 8,101,510 B2 | 1/2012 | Godet et al. |
| 2007/0077780 A1* | 4/2007 | Wang ............... H01J 37/32082 438/780 |
| 2007/0224830 A1* | 9/2007 | Samoilov ............ B08B 7/0035 438/714 |
| 2012/0135273 A1 | 5/2012 | Horng et al. |
| 2012/0135543 A1 | 5/2012 | Shin et al. |
| 2014/0038311 A1 | 2/2014 | Kim et al. |
| 2014/0187035 A1* | 7/2014 | Posseme ........... H01L 21/02063 438/618 |

\* cited by examiner

METHODS FOR HIGH TEMPERATURE ETCHING A MATERIAL LAYER USING PROTECTION COATING

BACKGROUND OF THE DISCLOSURE

Field

The embodiments herein generally relate to an etching process for etching a dielectric layer, such as an anti-reflective coating (ARC) layer with high selectivity and good profile control.

Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing etch processes that are capable of reliably forming features with such high aspect ratios presents a significant challenge. Traditionally, features in a material layer having aspect ratios of about 10:1 or so were fabricated by anisotropically etching dielectric layers to a predetermined depth and width.

During etching, redeposition or build-up of by-products or other materials generated during the etching process may accumulate on the top and/or sidewalls of the features being etched, thereby blocking the opening of the feature being formed in the material layer. As the opening of the etched features are narrowed and/or sealed by the accumulated redeposition of material, the reactive etchants are prevented from reaching the lower surface of the features, thus limiting the aspect ratio that may be obtained. Additionally, as the redeposition material or build-up of by-products may randomly and/or irregularly adhere to the top surface and/or sidewalls of the features being etched, the resulting irregular profile and growth of the redeposition material may alter the flow path of the reactive etchants, thereby resulting in bowing or twisting profiles of the features formed in the material layer.

Furthermore, in some cases, after the etching process, the corner features often suffer from rounded top shoulder erosion or undesired non-vertical sidewall etched profile, resulting in critical dimension (CD) loss or deformed profiles. In accurate profile or structural dimensions may result in collapse of the device structure, eventually leading to device failure and product low yield. Poor etching selectivity and control occurring during manufacturing processes for such shapes or features in the material layer may undesirably result in an inaccurate profile control, thus eventually leading to device failure.

As the need for accurate pattern transfer for the manufacturing of structures having small critical dimensions and high aspect ratios has become increasingly difficult, an intermediate layer (e.g., silicon oxynitride, silicon carbide or carbon film), called a hardmask layer, is often used with a bottom anti-reflective coating (BARC) and/or an anti-reflective coating (ARC) disposed thereunder along with the photoresist layer to facilitate pattern transfer because of its greater resistance to chemical etchants. After a long period of exposure to the aggressive etchants, the hardmask layer as well as the bottom anti-reflective coating (BARC) and/or an anti-reflective coating (ARC) without sufficient etching resistance or sidewall protection may be damaged, resulting in inaccurate pattern transfer and loss of dimensional control. Thus, during the bottom anti-reflective coating (BARC) and/or an anti-reflective coating (ARC) open process, the occurrence of sidewall profile damage and/or post-etch sidewall roughness in small critical dimension structures pose a significant challenge to structure profile integrity, especially when significant critical dimensions (CD) shrinkage is required during a bottom anti-reflective coating (BARC) and/or an anti-reflective coating (ARC) open process, which may ultimately deteriorate overall device performance.

Therefore, there is a need in the art for improved methods for etching features with high aspect ratios and small dimensions.

SUMMARY

Methods for etching a bottom anti-reflective coating (BARC) and/or an anti-reflective coating (ARC) and/or a dielectric anti-reflective coating (DARC) to form high aspect ratio features using an etch process are provided. The methods described herein advantageously facilitate profile and dimension control of features with high aspect ratios through a proper sidewall and bottom management scheme during the bottom anti-reflective coating (BARC) and/or an anti-reflective coating (ARC) and/or a dielectric anti-reflective coating (DARC) open process. In one embodiment, a method for etching a dielectric anti-reflective coating (DARC) layer to form features in the DARC layer includes supplying an etching gas mixture onto a DARC layer disposed on a substrate, wherein the substrate is disposed on a substrate support pedestal assembly disposed in a processing chamber, controlling a temperature of the substrate support pedestal assembly greater than 110 degrees Celsius, and etching the DARC layer disposed on the substrate.

In another embodiment, a method for etching a dielectric anti-reflective coating (DARC) layer to form features in the DARC layer includes etching a DARC layer disposed on a substrate while forming a passivation protection on the DARC layer, wherein the substrate is disposed on a substrate support pedestal assembly disposed in a processing chamber, wherein the DARC layer is a SiON layer, and controlling a temperature of the substrate support pedestal assembly at between about 160 degrees Celsius and about 250 degrees Celsius during the etching process In yet another embodiment, a method for etching a dielectric anti-reflective coating (DARC) layer to form features in the DARC layer includes supplying an etching gas mixture includes a silicon containing gas, a carbon fluorine containing gas, a halogen containing gas and a reacting gas to etch a DARC layer disposed on a substrate while forming a passivation protection on the substrate, wherein the substrate is disposed on a substrate support pedestal assembly disposed in a processing chamber, and controlling a temperature of the substrate support pedestal assembly at between about 160 degrees Celsius and about 250 degrees Celsius during the etching process.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

It is to be noted, however, that the appended drawings illustrate only exemplary examples and are therefore not to be considered limiting of its scope, for the invention may admit to other equally effective embodiments.

DETAILED DESCRIPTION

Embodiments for the present application includes methods for etching a bottom anti-reflective coating (BARC) and/or an anti-reflective coating (ARC) (or called a dielectric ARC (DARC)) to form features having high aspect ratios. In one embodiment, the method includes plasma etching a bottom anti-reflective coating (BARC) and/or an anti-reflective coating (ARC) and/or DARC using a controlled gas ratio and relatively high temperature regime at substrate support pedestal assembly, such as greater than 110 degrees Celsius. By utilizing a proper temperature management of a substrate support pedestal assembly, a sidewall/surface protection layer formed during the etching process may be managed to efficiently control the etching profile while etching the bottom anti-reflective coating (BARC) and/or an anti-reflective coating (ARC) and/or DARC. The good bottom as well as sidewall protection during the etching process may assist etching the bottom anti-reflective coating (BARC) and/or an anti-reflective coating (ARC) and/or DARC with a desired profile, thus assisting transferring features with desired high aspect ratios to the underlying structures while retaining good profile control and critical dimensions.

Figure 1:
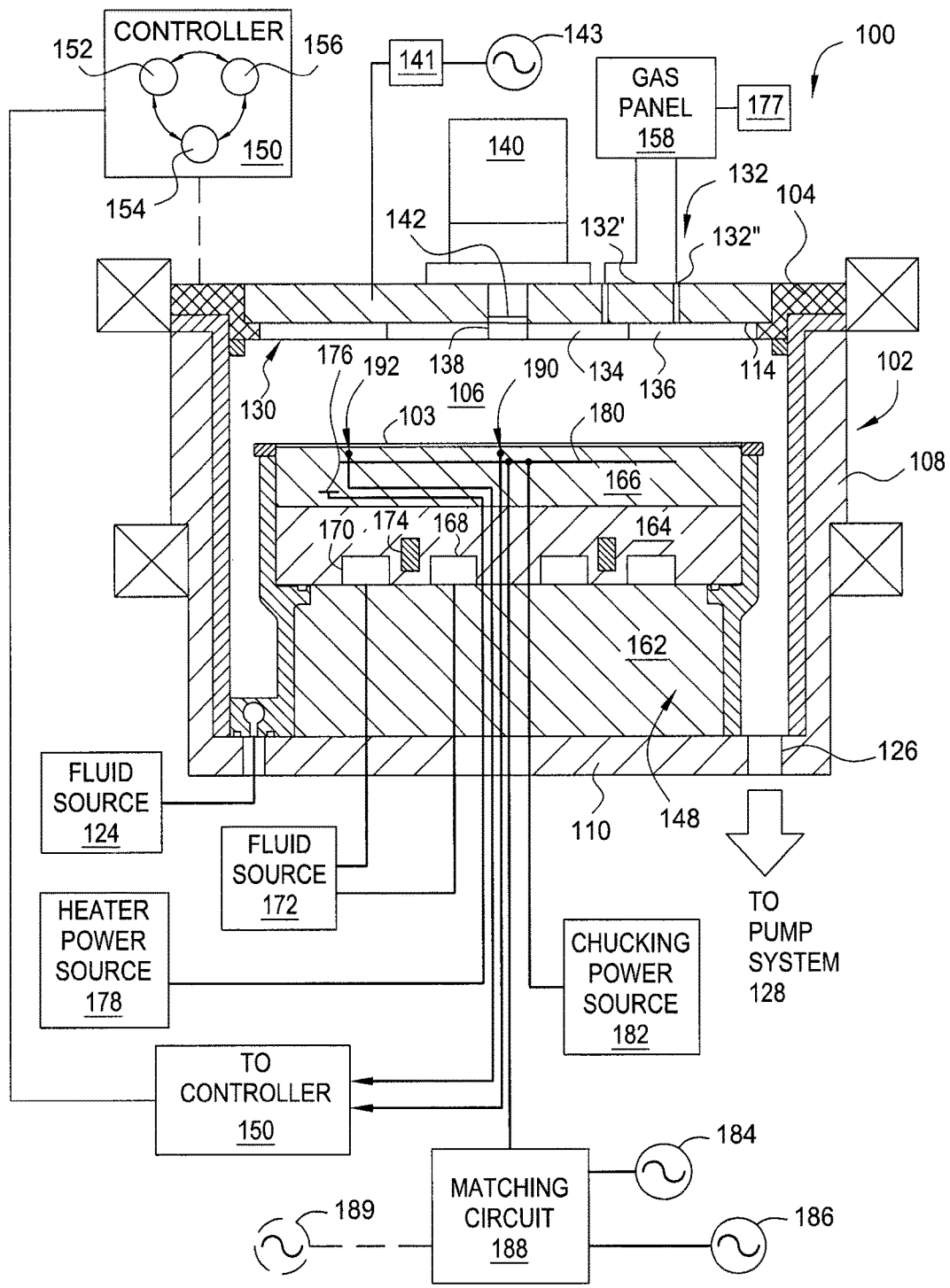
FIG. 1 depicts a processing chamber that may be utilized to form a dielectric layer.

FIG. 1 is a sectional view of one example of a processing chamber 100 suitable for performing a patterning process to etch a bottom anti-reflective coating (BARC) and/or an anti-reflective coating (ARC) and/or DARC on a substrate using an etching process. Suitable processing chambers that may be adapted for use with the teachings disclosed herein include, for example, an ENABLER® or C3® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 100 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one implementation, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the electrostatic chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias sources 184, 186. The RF bias power sources 184, 286 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

During operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 200 are handled through numerous signal cables.

Figure 2:
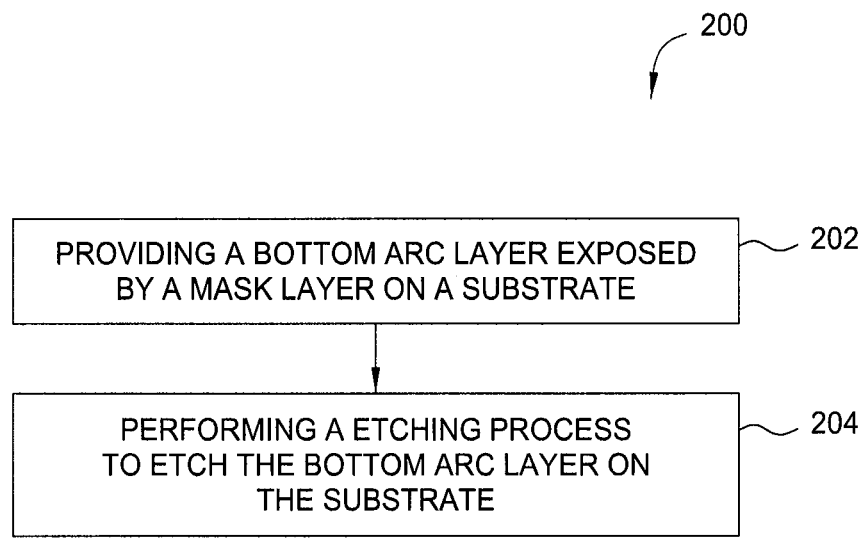
FIG. 2 depicts a flow diagram for performing a spacer layer patterning process.

FIG. 2 illustrates a flow diagram of a method 200 for etching a dielectric ARC (DARC) layer disposed on a substrate. FIGS. 3A-3D are cross-sectional views of a portion of a substrate 304 with corresponding to various stages of the method 200. The method 200 may be utilized to form high aspect ratio features, e.g., greater than 100:1, for structures, such as a contact structure, gate structure, NAND structure or interconnection structure for logic or memory devices as needed. Alternatively, the method 200 may be beneficially utilized to etch other types of structures.

The method 200 begins at operation 202 by transferring (i.e., providing) a substrate 304 to an etch process chamber, such as the etch chamber 100 depicted in FIG. 1. In the embodiment depicted in FIG. 3A, the substrate 304 has a film stack 302 having a patterned mask layer 312 disposed on a dielectric anti-reflective coating layer 310 (a DARC layer) disposed on a dielectric layer 308. An optional structure 306 (shown by the dotted line 305) may be formed on the substrate 304 when needed. The optional structure 306 may include composite film layers, including pairs of alternating silicon oxide layer and silicon nitride layers (ONON structure) or pairs of alternating silicon oxide layer and polysilicon layers (OPOP structure). It is noted that the optional structure 306 may be any suitable structures, including a single layer, multiple layers or any other configurations as needed.

The patterned mask layer 312 defines openings 314 that expose a surface 316 of the underlying DARC layer 310 for etching. The substrate 304 may be any one of semiconductor substrates, silicon wafers, glass substrates and the like. The substrate 304 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 304 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

In one embodiment, the patterned mask layer 312 may be a hard mask, a photoresist mask or a combination thereof. A photoresist layer (not shown) may or may not be present on the substrate 304 when the patterned mask layer 312 is already patterned. The patterned mask layer 312 is used as an etch mask to etch features in the DARC layer 310 (so called ARC open process), which may be facilitated to serve as an etch mask for patterning the underlying dielectric layer 308 with desired aspect ratios. The features described herein may include trenches, vias, openings and the like. In one embodiment, the patterned mask layer 312 may be a material selected from a group consisting of silicon, silicon oxide, silicon nitride, silicon oxynitride, silicon carbide, amorphous carbon, doped amorphous carbon, carbon containing materials, and combinations thereof. In an exemplary embodiment depicted herein, the mask layer 312 is an amorphous carbon layer. One example of the amorphous carbon layer may be an Advanced Patterning Film™ (APF) available from Applied Materials, Inc.

In one example, the DARC layer 310 to be etched here may be a dielectric layer, such as silicon containing material including SiON, SiN, $SiO_2$, Si, or composite layers including SiON or SiN, or $SiO_2$, or any suitable materials as needed.

The dielectric layer 308 may be a dielectric material. Suitable exemplary materials for the dielectric layer include undoped silicon glass (USG), such as silicon oxide or TEOS, boron-silicate glass (BSG), phosphorus-silicate glass (PSG), boron-phosphorus-silicate glass (BPSG), high-k material, low dielectric constant insulating materials (e.g., dielectric constants less than about 4.0) and combinations thereof. Examples of low dielectric constant insulating materials include silicate glass, fluorosilicate glass (FSG), and carbon doped silicon oxide (SiOC), silicon carbide (SiC) and nitrogen containing silicon carbide (SiCN), among others. In an exemplary embodiment depicted herein, the dielectric layer 308 is an undoped silicon glass (USG) layer. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. In one embodiment, the dielectric layer 308 has a thickness between about 3000 Å to about 15000 Å, such as between about 4000 Å to about 12000 Å, for example about 10000 Å.

Figure 3A:
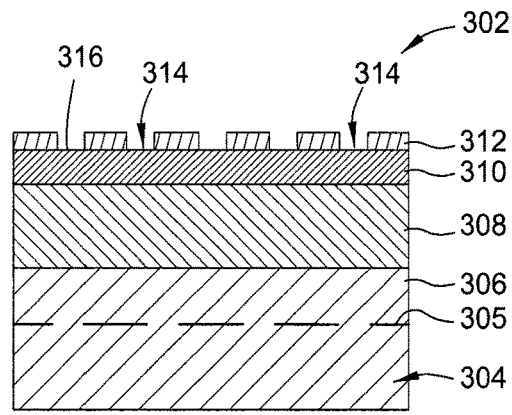
FIGS. 3A-3D depict a film stack at various stages during an etching process to etch a dielectric layer in a substrate utilizing the process depicted in FIG. 2.

In the embodiment depicted in FIG. 3A, the dielectric layer 308 is a silicon oxide layer having a thickness between about 10 nm and about 10,000 nm. The patterned mask layer 312 is an amorphous carbon layer and the patterned DARC layer 310 is a SiON layer.

Figure 3B:
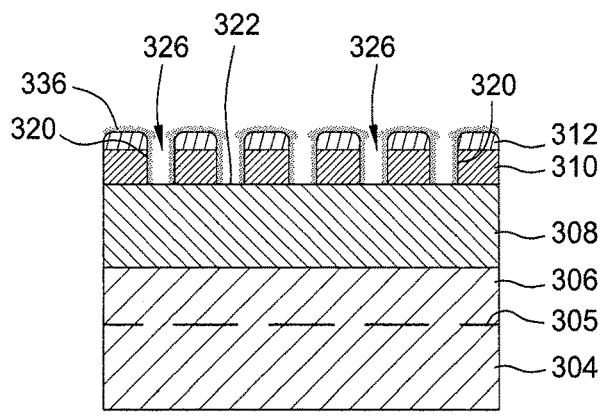

At operation 204, an etching process is performed to etch the DARC layer 310, as shown in FIG. 3B. During etching, a selected gas mixture is supplied into the processing chamber 100 to etch the DARC layer 310 as well as protect sidewall 320 of the DARC layer 310. As the dimensions of the openings 314 defined by the patterned mask layer 312 is maintaining small (e.g., less than 100 nm), a gas mixture as well as process parameters for etching the DARC layer 310 requires to be carefully selected so as to etching the DARC layer 310 with good profile control without damaging a surface 326 of the patterned mask layer 312 and also the underlying dielectric layer 308.

In one example, the etching process is performed by supplying an etching gas mixture into the processing chamber while maintaining a temperature of the substrate support pedestal assembly 148 greater than 110 degrees Celsius. It is believed that high temperature etching process performed to etching the DARC layer 310 may facilitate good control of the etching behaviors, such as good sidewall/surface protection, without overly and aggressively damaging the patterned mask layer 312. In one example, the temperature of the substrate support pedestal assembly 148 may be controlled at greater than 110 degrees Celsius, such as between about 130 degrees Celsius and about 300 degrees Celsius, for example between about 160 degrees Celsius and about 250 degrees Celsius, such as 225 degrees Celsius.

In one example, the etching gas mixture includes at least one carbon fluorine containing gas and at least one silicon containing gas. The carbon fluorine gas that may be supplied in the gas mixture may be $CHF_3$, $CH_2F_2$, $CF_4$, $C_2F$, $C_4F_6$, $C_3F_8$, HCl, $C_4F_8$, $Cl_2$, $CCl_4$, $CHCl_3$, $CHF_3$, $C_2F_6$, $CH_2Cl_2$, and $CH_3Cl$. Suitable examples of the silicon containing gas include $SiCl_4$, $Si_2Cl_6$, $SiH_4$, $Si_2H_6$, and the like. A halogen containing gas may also be supplied in the gas mixture. Halogen containing gas may include a fluorine containing gas, a chlorine containing gas, or a bromide containing gas. Suitable examples of the halogen containing gas include $SF_6$, $SiCl_4$, $Si_2Cl_6$, $NF_3$, HBr, $Br_2$ and the like. Particularly, examples of the chlorine containing gas include HCl, $Cl_2$, $CCl_4$, $CHCl_3$, $CH_2Cl_2$, $CH_3Cl$, $SiCl_4$, $Si_2Cl_6$, and the like, and examples of the bromide containing gas include HBr, $Br_2$ and the like. A reacting gas, such as an oxygen containing gas or a nitrogen containing gas, for example, $O_2$, $N_2$, $N_2O$, $NO_2$, $O_3$, $H_2O$, or the like may also be supplied in the etching gas mixture as needed. In one particular example, the halogen containing gas used in the etching gas mixture is $CHF_3$ and the silicon containing gas used in the etching gas mixture include $SiCl_4$. The halogen containing gas is $Cl_2$ and the reacting gas is $O_2$.

As the etching gas mixture includes a silicon containing gas and a reacting gas, such as an oxygen containing gas or nitrogen containing gas, the passivation protection 336, thus, forms on the DARC layer 310 is formed from a material selected from the group consisting of $SiO_2$, SiON and SiN.

While supplying the etching gas mixture into the processing chamber, an inert gas may be optionally supplied into the etching gas mixture to assist the profile control as needed. Examples of the inert gas supplied in the gas mixture include Ar, He, Ne, Kr, Xe or the like.

Figure 3C:
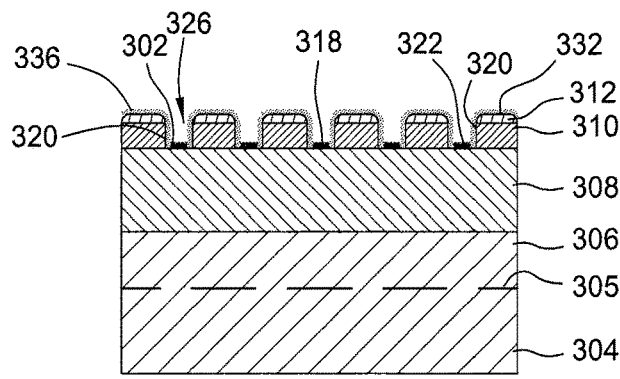
Figure 3D:
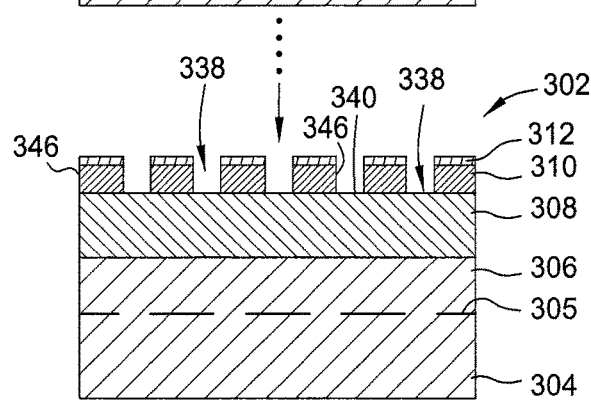

In one example, during the etching process, a passivation protection 336 is formed while etching. It is believed that the higher gas flow rate of the silicon containing gas supplied in the gas mixture may facilitate forming higher amount of the passivation protection 336 on the sidewall 320 of the DARC layer 310 as well as on the patterned mask layer 312 for protection during the etching process, as shown in FIG. 3B. In some examples, the gas mixture may be adjusted and well selected to form the passivation protection 336 on the exposed surface 322 of the underlying dielectric layer 318 (or still half way down of the DARC layer 310 when the DARC layer 310 is not fully opened), as shown in FIG. 3C, during the etching process as needed.

When continuously etching the DARC layer 310, a relatively higher amount of the halogen containing gas and/or carbon fluorine containing gas supplied in the etching gas mixture may assist etching the DARC layer 310 with relatively vertical profile control with good dimension precision for pattern transfer. Thus, when the passivation protection 336 is consumed and required to be replenished, a higher amount of the silicon containing gas in the gas mixture may be supplied. Similarly, when sufficient amount of the passivation protection 336 is remained on the substrate, a relatively higher amount of the carbon fluorine containing gas and/or the halogen containing gas may be used to etch DARC layer 310 with desired vertical profile. Thus, by carefully selecting a ratio between the silicon containing gas as well as the halogen containing gas/carbon fluorine containing gas, a good vertical profile control as well as integrity of the DARC layer dimension/structure may be obtained to simultaneously etching the DARC layer 310 while forming the passivation protection 336. Although the feature etching process and the passivation protection formation occur simultaneously, the etching rate is controlled to be slightly greater that the passivation protection formation rate so as to ensure the feature etching process can progress and continuously be performed until the passivation protection 336 needed to be replenished.

During etching, the chamber pressure of the etching gas mixture is also regulated. In one exemplary embodiment, a process pressure in the plasma processing chamber is regulated between about 2 mTorr to about 100 mTorr, for example, at about 3 mTorr and 20 Torr, such as about 6 mTorr. RF source power may be applied to maintain a plasma formed from the first mode of the etching gas mixture. For example, a RF source power with a frequency of about 13.56 MHz may be applied at an energy level of between about 200 Watts to about 1000 Watts, such as about 500 Watts, to an inductively coupled antenna source to maintain a plasma inside the etch chamber. In addition, a RF bias power, with a frequency of between about 2 MHz and about 13.56 MHz, may be applied less than 500 Watts, such as between about 100 Watts to about 450 Watts, such as about 150 Watts. A substrate temperature is maintained greater than 110 degrees Celsius, such as between about 130 degrees Celsius and 300 degrees Celsius, for example between about 160 degrees Celsius and about 250 degrees Celsius, such as about 225 degrees Celsius.

In one example of the etching gas mixture supplied at operation 204, the $O_2$ gas may be supplied into the chamber at a rate between about 10 sccm to about 200 sccm, such as between about 20 sccm and about 100 sccm, for example about 50 sccm. The carbon fluorine containing gas, $CHF_3$, may be supplied at a flow rate between about 50 sccm and about 500 sccm, such as about 120 sccm. The halogen-containing gas, $Cl_2$, may be supplied at a flow rate between about 50 sccm and about 500 sccm, such as about 300 sccm. The silicon containing gas, $SiCl_4$, may be supplied at a flow rate between about 10 sccm and about 100 sccm, such as about 30 sccm.

Alternatively, the $SiCl_4$ gas and the $CHF_3$ gas may be supplied in the first mode at a flow ratio (i.e., $SiCl_4$:$CHF_3$) by volume of between about 1:1 and about 1:100, such as between about 1:2 and about 1:10, for example about 1:4. The $SiCl_4$ gas and the $Cl_2$ gas may be supplied in the first mode at a flow ratio $SiCl_4$:$Cl_2$) by volume of between about 1:1 and about 1:100, such as between about 1:1 and about 1:20, for example about 1:10. The $SiCl_4$ gas and the $O_2$ gas may be supplied at a flow ratio (i.e., $SiCl_4$:$O_2$) by volume of between about 1:1 and about 1:10.

Figure 4:
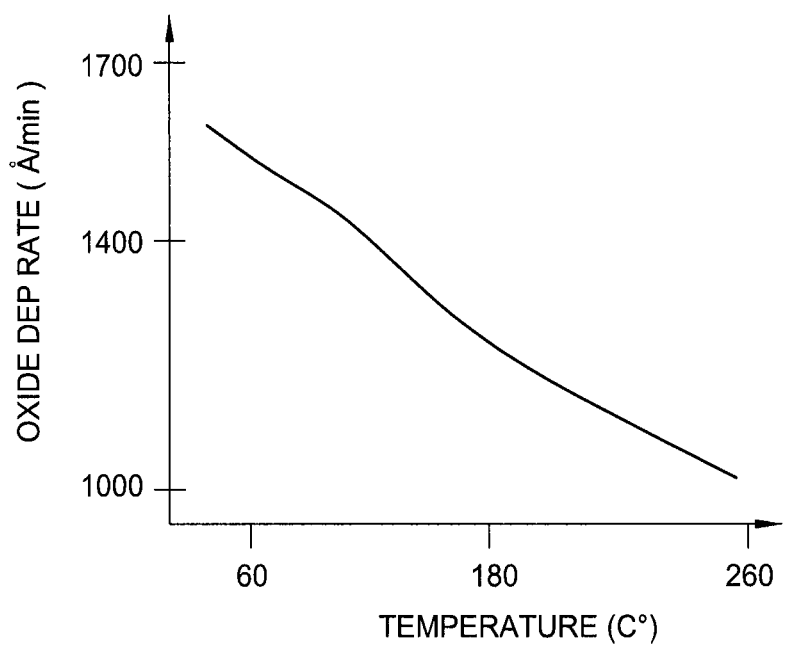
FIG. 4 is a plot of a deposition rate as a function of temperature according to an embodiment described herein To facilitate understanding of the embodiments, identical reference numerals have been used, where possible, to designate identical elements that are common to the figures. It is contemplated that elements and features of one embodiment may be beneficially incorporated in other embodiments without further recitation.

As discussed above, during etching of the DARC layer 310, a relative high temperature control of the substrate support pedestal assembly 148 is controlled. FIG. 4 depicts a diagram of a deposition rate of the passivation protection 336 plotted by a function of temperature of the substrate support pedestal assembly 148. It is believed that the deposition rate of the passivation protection 336 is decreased proportionally with the increase of the temperature of the substrate support pedestal assembly 148. Thus, by well control of the temperature range of the substrate support pedestal assembly 148, growth of the passivation protection 336 may be encouraged or inhibited during the etching process, so as to assist controlling the protection and/or exposure of the DARC layer 310 during the etching process. Thus, by well control/balance of the ratio of the etching gas mixture supplied during the etching process as well as a proper temperature range of the substrate support pedestal assembly 148, a controlled trajectory and directionality of the ions from the plasma generated during the etching process may be obtained. Thus, a controlled etching behavior as well as a passivation protection contribution may be obtained so as to efficiently etch the DARC 310 in a manner that would yield a desired resultant film profile.

Thus, by utilizing simultaneous etching/deposition with a selected etching gas mixture at a controlled high temperature of the substrate support pedestal assembly, the DARC layer 310 may be etched and shaped in a controlled manner that can provide the desired profile with the desired substantially sharp right angle and upright (e.g., straight, vertical) sidewalls 346 with steep slope and accurate dimensions.

Thus, embodiments of etching a DARC layer to form features with desired edge/corner profile and desired aspect ratios are provided. By utilizing high temperature control, greater than 110 degrees Celsius, of the substrate support pedestal assembly as well as selected ratio of the gas mixture, a controlled ion trajectory/directionality as well as sidewall/corner passivation protection may be obtained so as to etch the DARC in a desired manner that yields features in the DARC layer with desired accurate and right angle corners and vertical sidewall profile as well as feature aspect ratios.

While the foregoing is directed to embodiments of the present invention, other and further embodiments of the invention may be devised without departing from the basic scope thereof, and the scope thereof is determined by the claims that follow.

What is claimed is:

1. A method for etching a dielectric anti-reflective coating (DARC) layer to form features in the DARC layer, comprising:
   supplying an etching gas mixture onto a DARC layer disposed on a substrate, wherein the substrate is disposed on a substrate support pedestal assembly disposed in a processing chamber, wherein the etching gas mixture include at least a silicon containing gas, a carbon fluorine containing gas, a halogen containing gas and a reacting gas;
   etching the DARC layer at a first rate greater than a second rate for forming a passivation layer on the DARC layer, wherein the first rate greater than the second rate is controlled by supplying the halogen containing gas at a ratio greater than the silicon containing gas in the etching gas mixture;
   controlling a temperature of the substrate support pedestal assembly between about 160 degrees Celsius and about 250 degrees Celsius; and
   adjusting a flow rate of the halogen containing gas while etching the DARC layer and simultaneously forming the passivation layer on the DARC layer while maintaining the temperature of the substrate support pedestal assembly between about 160 degrees Celsius and about 250 degrees Celsius, wherein the halogen containing gas is adjusted to have a ratio less than the silicon containing gas in the etching gas mixture.

2. The method of claim 1, wherein the DARC layer is a SiON layer.

3. The method of claim 2, wherein the substrate further comprises a dielectric layer disposed between the substrate and the DARC layer.

4. The method of claim 1, wherein the silicon containing gas is $SiCl_4$ and the reacting gas is $O_2$.

5. The method of claim 1, wherein the carbon fluorine containing gas is $CHF_3$.

6. The method of claim 1, wherein the halogen containing gas is $Cl_2$.

7. The method of claim 1, wherein the passivation layer is formed from a material selected from the group consisting of $SiO_2$, SiON and SiN.

8. The method of claim 1, wherein a RF source power and a RF bias power energize the etching gas mixture to form a plasma from the etching gas mixture.

9. The method of claim 1, wherein the silicon containing gas and the reacting gas is supplied in the etching gas mixture at a ratio between about 1:1 and about 1:100.

10. The method of claim 1, wherein the silicon containing gas and the carbon fluorine containing gas is supplied at a ratio between about 1:1 and about 1:100.

11. The method of claim 1, wherein the substrate further comprises a patterned hardmask layer disposed on the DARC layer, wherein the patterned hardmask layer is a carbon containing material.

12. The method of claim 1, wherein the carbon fluorine containing gas or the halogen containing gas is supplied greater than the silicon containing gas.

13. A method for etching a dielectric anti-reflective coating (DARC) layer to form features in the DARC layer, comprising:
   etching a DARC layer disposed on a substrate while forming a passivation protection on the DARC layer by supplying an etching gas mixture into a processing chamber, wherein the substrate is disposed on a substrate support pedestal assembly disposed in the processing chamber, wherein the DARC layer is a SiON layer, wherein the etching gas mixture include at least a silicon containing gas, a carbon fluorine containing gas, a halogen containing gas and a reacting gas, wherein the halogen containing gas is supplied at a ratio greater than the silicon containing gas in the etching pas mixture;
   adjusting a flow rate of the halogen containing gas while etching the DARC layer and simultaneously forming the passivation layer on the DARC layer wherein the halogen containing gas is adjusted to have a ratio less than the silicon containing gas in the etching gas mixture to facilitate forming the passivation layer; and
   controlling a temperature of the substrate support pedestal assembly between about 160 degrees Celsius and about 250 degrees Celsius during the etching process and forming the passivation layer.

14. The method of claim 13, wherein the substrate further comprises a patterned mask layer disposed on the DARC layer, wherein the patterned mask layer is a carbon containing layer.

15. The method of claim 13, wherein the substrate further comprises a dielectric layer disposed between the DARC layer and the substrate.

16. A method for etching a dielectric anti-reflective coating (DARC) layer to form features in the DARC layer, comprising:
   supplying an etching gas mixture includes a silicon containing gas, a carbon fluorine containing gas, a halogen containing gas and a reacting gas to etch a DARC layer disposed on a substrate while simultaneously forming a passivation protection on the substrate, wherein the substrate is disposed on a substrate support pedestal assembly disposed in a processing chamber, wherein the substrate further comprises a patterned mask layer disposed on the DARC layer, wherein the patterned mask layer is a carbon containing layer and the DARC layer is a SiON layer;
   adjusting a flow rate of the halogen containing gas from a rate greater than the silicon containing gas while etching the DARC layer and subsequently to a rate less than the silicon containing gas while simultaneously forming a passivation layer on the DARC layer; and
   controlling a temperature of the substrate support pedestal assembly between about 160 degrees Celsius and about 250 degrees Celsius during the etching process.

* * * * *